United States Patent
Kondoh

(10) Patent No.: US 8,237,043 B2
(45) Date of Patent: Aug. 7, 2012

(54) INTEGRATED PARALLEL PELTIER/SEEBECK ELEMENT CHIP AND PRODUCTION METHOD THEREFOR, CONNECTION METHOD

(75) Inventor: Yoshiomi Kondoh, Gunma (JP)

(73) Assignees: Meidensha Corporation, Tokyo (JP); Yoshiomi Kondoh, Maebashi-shi (JP)

(*) Notice: Subject to any disclaimer, the term of this patent is extended or adjusted under 35 U.S.C. 154(b) by 869 days.

(21) Appl. No.: 11/631,334

(22) PCT Filed: Jun. 29, 2005

(86) PCT No.: PCT/JP2005/011995
§ 371 (c)(1),
(2), (4) Date: Dec. 29, 2006

(87) PCT Pub. No.: WO2006/003956
PCT Pub. Date: Jan. 12, 2006

(65) Prior Publication Data
US 2007/0256722 A1 Nov. 8, 2007

(30) Foreign Application Priority Data
Jun. 30, 2004 (JP) .................. 2004-194596

(51) Int. Cl.
*H01L 35/34* (2006.01)
*H01L 35/28* (2006.01)
*H01L 35/30* (2006.01)
*H01L 21/00* (2006.01)

(52) U.S. Cl. .......... 136/203; 136/201; 136/205; 438/54; 438/55

(58) Field of Classification Search ............... 438/54, 438/55; 136/201, 203, 205
See application file for complete search history.

(56) References Cited

U.S. PATENT DOCUMENTS
3,819,418 A * 6/1974 Winkler et al. ............... 136/205
6,314,741 B1 * 11/2001 Hiraishi ........................ 62/3.7
2004/0226599 A1 11/2004 Kondoh FOREIGN PATENT DOCUMENTS
JP 60-033462 * 3/1985
JP 63-070038 U 5/1988
JP 8-153899 A 6/1996
JP 11-118616 A 4/1999
(Continued)

OTHER PUBLICATIONS
Translation of WO02-101912, pub. Dec. 2002.*

*Primary Examiner* — Basia Ridley
*Assistant Examiner* — Allison Bourke
(74) *Attorney, Agent, or Firm* — Foley & Lardner LLP

(57) ABSTRACT

First and second conductive members having different Seebeck coefficients are formed on an insulating substrate. The first and second conductive members are connected by ohmic contact, and the surfaces connected by ohmic contact are covered with a material sheet having a superior heat conductivity and an electric insulating property in the junction surface, such as an aluminum sheet formed with surfaces provided with electric insulating property by alumite treatment or the like. On the opposite side, bonding wires are connected with the first and second conductive members by ohmic contact. The bonding wires are insulated from one another, and used as output terminals of an integrated parallel Peltier Seebeck element chip. The thus produced integrated parallel Peltier Seebeck element chips are connected by one or more serial or parallel cables, to form energy conversion apparatus from electricity to heat and thermal energy transfer apparatus.

22 Claims, 12 Drawing Sheets

FOREIGN PATENT DOCUMENTS

| | | |
|---|---|---|
| JP | 11-243169 A | 9/1999 |
| JP | 2003-004546 A | 1/2003 |
| JP | 2003-023185 A | 1/2003 |
| JP | 2003-092433 A | 3/2003 |
| JP | 2003-110155 A | 4/2003 |
| WO | WO02-101912 | * 12/2002 |

* cited by examiner

US 8,237,043 B2

INTEGRATED PARALLEL PELTIER/SEEBECK ELEMENT CHIP AND PRODUCTION METHOD THEREFOR, CONNECTION METHOD

TECHNICAL FIELD

The present invention relates to a fabricating process for producing an integrated parallel Peltier Seebeck element chip for conversion from energy in one form to energy in another form or transfer of heat energy, an integrated parallel Peltier Seebeck element chip produced by this fabricating process, a connecting process of connecting a plurality of integrated parallel Peltier Seebeck element chips, and an integrated Peltier Seebeck panel or sheet in which a plurality of the integrated parallel Peltier Seebeck element chips are connected. Moreover, the present invention relates to heat energy electric energy direct conversion system and heat energy transfer system produced by the integrated parallel Peltier Seebeck element chip.

BACKGROUND ART

Currently, in the world, energy is used mostly in the form of fossil fuel, atomic power, water energy etc. in an irreversible manner. Especially, the consumption of fossil fuel is a factor for accelerating global warming and environmental disruption. Accordingly, development has advanced for so-called clean energy lowering the load on the environment, by the use of solar energy generation, wind power generation, or hydrogen gas. However, the development of clean energy is still in a nascent stage, and there still remains a considerably long way to go until the use as a substitute for fossil fuel and atomic energy.

Although thermal energy exists inexhaustibly in the natural world, on the other hand, the technique to take out the thermal energy in the form of mechanical energy or chemical energy is not yet developed to a level of practical use. The principle of conversion from thermal energy into a directly usable form such as electric power is known as Peltier effect or Seebeck effect. That is, radiating or absorbing heat is produced other than Joule heat when current flows through conductors of two different kinds which are connected and held at a uniform temperature. This effect is the phenomenon first discovered by J. C. A. Peltier in 1834, and called Peltier effect. Moreover, when copper wires of two different kinds are connected, the two contact points are held at different temperatures T1 and T2, and one of the conductive wires is cut, then an electromotive force is produced between the cut ends. This phenomenon was first discovered by J. J. Seebeck in 1821. The electromotive force generated between the two ends is called thermal electromotive force, and this phenomenon is called Seebeck effect in honor of the discoverer.

The development of a thermoelectric converter element (Seebeck element) utilizing the Seebeck effect is attracting attention as substitute energy for fossil fuel and atomic power. The thermo-electromotive force of the Seebeck element is dependent on the temperatures of the two contact points, and moreover on the materials of the two conductor wires, and a derivative value obtained by dividing the thermo-electromotive force by a temperature variation is called a Seebeck coefficient. The Seebeck element is formed by contacting two conductors (or semiconductors) different in the Seebeck coefficient. Due to difference in the number of free electrons in the two conductors, electrons move between the two conductors, resulting in a potential difference between the two conductors. If heat energy is applied to one contact point, the movement of free electrons is activated at the contact point, but the free electron movement is not activated at the other contact point being provided with no heat energy. This temperature difference between the contact points, that is the difference in the activation of free electrons, causes conversion from heat energy to electric energy. This effect is generally referred to as thermoelectric effect.

The inventor(s) (applicant) of the present application has invented and proposed a thermoelectric conversion apparatus utilizing the Seebeck effect and an energy conversion system utilizing this (cf. patent document 1).

FIG. 13 shows as one example of the technique disclosed in the patent document 1, a thermal energy to electric energy direct conversion system. This system includes a thermal energy to electric power direction conversion section 100 converting thermal energy from a heat source directly to electric potential energy by the Seebeck effect with a circuit composed of series connected stages of thermoelectric effect elements 101, and an electrolysis section 200 disposed as a load circuit at the output voltage end, for converting to chemical potential energy by electrolysis of water.

The thermoelectric effect element 101 constituting the conversion section 100 for directly converting thermal energy to electric power by the Seebeck effect is formed by connecting first and second thermoelectric conversion elements 102 and 103. The first thermoelectric conversion element 102 is composed of first and second conductive members A102 and B102 having different Seebeck coefficients and joining member d102, and the second thermoelectric conversion element 103 is composed of first conductive member A103, joining member d103 and second conductive member B103. As shown in FIG. 13, the elements constituting the first thermoelectric conversion element 102 and second thermoelectric conversion element 103 are formed by connecting a plurality of Peltier Seebeck elements in a series form. By the use of heat energy of a heat source such as an auxiliary heater, the temperature T1 of the joining members d102 is set higher than the temperature T2 of the joining members d103. That is T1>T2.

When a switch SW shown in FIG. 13 is turned on, a current $I_L$ flows through the first and second thermoelectric conversion elements 102 and 103 alternately. The current $I_L$ flows from the first conductive member A102 through the joining member d102 to the second conductive member B102 in one of the first thermoelectric conversion elements 102; then the current $I_L$ flows from the second conductive member B103 through the joining member d103 to the first conductive member A103 of the next second thermoelectric conversion element 103; and the current $I_L$ further flows again to the part of the first thermoelectric conversion elements 102. The output terminal end is connected to the load circuit which, in this example, is the electrolysis section 200 converting to chemical potential energy by electrolysis of water. The distance between the first thermoelectric conversion elements 102 and the second thermoelectric conversion elements 103 is set at such a value as to hold the temperature state of T1>T2. This distance may be set at a value in a wide range from a very short length of about several microns, to a long length of several hundreds kilometers or more.

Patent document 1: Published Japanese Patent Application JP2003-92433A.

However, in the invention disclosed in the patent document 1, the process of producing the first and second thermoelectric conversion elements 102 and 103 requires operations of soldering first and second conductive members A and B and joining members d one by one. Therefore, a considerable time of skilled technicians is required for soldering, for example, and the production process is not efficient.

DISCLOSURE OF INVENTION

The present invention has been devised to solve the above-mentioned problem. It is an object of the present invention to provide a fabricating or producing process capable of producing, at a time, many integrated parallel Peltier Seebeck element chips usable as main portion of the above-mentioned thermoelectric conversion elements by utilizing the technique used exclusively in the fabrication of LSI, an integrated parallel Peltier Seebeck element chip produced by that process, a thermal energy to electric energy direction conversion system using a plurality of integrated parallel Peltier Seebeck element chips and a heat energy transfer system using a plurality of integrated parallel Peltier Seebeck element chips.

According to one aspect of the present invention, an integrated parallel Peltier Seebeck elements chip fabricating process comprises: a step of preparing a silicon substrate having a uniform thickness, the silicon substrate being one of an amorphous silicon substrate, a polycrystalline silicon substrate and a monocrystalline silicon substrate; a step of forming a plurality of chips by transferring, on the silicon substrate, a mask pattern to leave an even number of unoxidized portions in each chip; a step of causing a chemical reaction with oxygen by putting, in an oxidation furnace, the substrate formed with a negative resist for the unoxidized portions corresponding to the mask pattern, altering a remaining portion other than the portions corresponding to the mask pattern into silicon dioxide, and thereby forming the substrate in which the remaining portion of the substrate other then the unoxidized portions is altered as a whole into an electrical insulating material; a step of altering adjacent two of the unoxidized portions formed in one chip in the substrate, respectively, into first and second conductive members having different Seebeck coefficients; a step of forming a thermal conduction terminal portion by connecting, by ohmic contact, surfaces of the adjacent first and second conductive members on one side with a first conductive joining member; a step of forming terminal side portions for the first and second conductive members by covering surfaces of the first and second conductive members on an opposite side opposite to the side on which the first conductive joining member is provided, with a second conductive joining member by ohmic contact; a step of connecting a plurality of third conductive joining members electrically with the terminal side portions of the first and second conductive members, respectively, and forming connecting terminal portions for connection to an external circuit in a state in which the third conductive junction members are arranged in parallel to one another, and insulated electrically from one another; and a step of repeating the above-mentioned steps for one chip, sequentially a number of times, over an entire surface of the substrate of the insulating material so that a plurality of chips are formed simultaneously.

According to another aspect of the present invention, an integrated parallel Peltier Seebeck element chip fabricating process comprises: a step of forming an even number of holes for each chip in an insulating substrate (insulating substrate of an insulating material, such as silicone rubber, having a required hardness) by using a mask pattern; a step of forming a plurality of chips each formed with the even number of holes, over the substrate by shifting the mask pattern; a step of filling, with a conductive material, the holes in each of groups each of which includes the even number of the holes in one chip; and altering the conductive material in adjacent two of the holes in each group, respectively, into first and second conductive members having different Seebeck coefficients; a step of forming a thermal conduction terminal portion by connecting, by ohmic contact, adjacent surfaces of the first conductive member and second conductive member on one side with a first conductive joining member which is conductive thermally and electrically; a step of forming terminal side portions for the first and second conductive members by covering surfaces of the first and second conductive members on an opposite side opposite to the side on which the first conductive joining member is provided, with a second conductive joining member by ohmic contact; a step of forming connecting terminal portions so that a plurality of third conductive joining members are connected electrically with the terminal side portions of the first and second conductive members, respectively, and the third conductive joining members are arranged in parallel to one another, insulated electrically from one another and adapted to be connected to an external circuit; and a step of repeating the above-mentioned steps for one chip, sequentially a number of times, over an entire surface of the substrate of the insulating material so that a plurality of chips are formed simultaneously.

According to still another aspect of the present invention, in the integrated parallel Peltier Seebeck element chip fabricating process a plurality of the thermal conduction terminal portions each connected by ohmic contact with the first and second conducive members bared in a lower surface of the integrated parallel Peltier Seebeck element chip are all joined with a material which is thermally conductive and electrically insulating so that the thermal conduction terminal portions are electrically insulated from one another, and arranged to quickly equalize temperatures of all the thermal conduction terminal portions of the first and second conductive members. As the material having a superior thermal conductivity and an electric insulating property in a joint surface, it is possible to use material so processed to have an electrically insulating surface by alumite treatment, for example.

According to still another aspect of the present invention, the integrated parallel Peltier Seebeck element chip fabricating process comprises: a step of cutting off a plurality of integrated parallel Peltier Seebeck element chips formed by the fabricating process, (individually with a cutter, for example); a step of attaching connection terminals by electrically connecting a plurality of electrically and thermally conductive metal lead wires, respectively, to connection terminals formed in a surface of each cut off integrated parallel Peltier Seebeck element chips; a step of molding with an insulating material in a form in which the metal lead wires are taken out in parallel, the metal lead wires are insulated by the insulating material from one another, and only connection terminal portions are projected out of the insulating material to make connection to an external circuit provided outside the integrated parallel Peltier Seebeck element chips; a step of connecting to make series or parallel a Peltier Seebeck circuit system connecting two of the integrated parallel Peltier Seebeck element chips.

Moreover, according to still another aspect of the present invention, an integrated parallel Peltier Seebeck element chip connecting process, comprises: preparing a serial or parallel cable of a desired length having a male or female multi terminal connector including terminals equal in number to connection terminals on the surface of the integrated parallel Peltier Seebeck element chip and preparing, as an extension cable, a parallel cable of a desired length having, at both ends, male and female multi terminal connectors, or male and male multi terminal connectors, or female and female multi terminal connectors; connecting a plurality of the integrated parallel Peltier Seebeck element chips by the multi terminal connectors so as to form a circuit system of a series configuration, by attaching the male or female multi terminal connectors to a second end of the serial cable of a desired length having, at a first end, the multi terminal connector of the female type for the male type multi terminal connector or of the male type for the female type.

Moreover, according to still another aspect of the present invention, in the integrated parallel Peltier Seebeck element chip connecting process, in order to connect the serial cables or parallel cables equipped with the multi terminal connectors, or to connect the serial cable or parallel cable to a two terminal external circuit, the multi terminal connectors of the male type and female type, or the male type and male type or the female type and female type are connected to both ends of the serial cable or parallel cable, and an integrated connector tap including male type and female type two terminal connectors is formed, and a multi terminal or two terminal short circuit terminal of a male type for a multi terminal or two terminal female connector portion and of a female type for a male type connector portion is formed for short circuiting.

Moreover, according to still another aspect of the present invention, an integrated parallel Peltier Seebeck element chip (formed, for example, by the above-mentioned process) comprises: first and second conductive members having different Seebeck coefficients formed in adjacent two of a plurality of rectangular unoxidized portions formed in an insulating substrate in a form of a lattice-shaped array corresponding to a mask pattern; a first conductive joining member connecting, by ohmic contact, surfaces of the adjacent first and second conductive members on one side to form a thermal conduction terminal portion; second conductive joining members covering, by ohmic contact, surfaces of the first and second conductive members on an opposite side opposite to the first conductive joining member, to form terminal side portions of the first and second conductive members; and third conductive joining members electrically connected, respectively, with the terminal side portions of the first and second conductive members, arranged in parallel to one another, insulated electrically from one another, and connected to an external circuit.

Moreover, according to still another aspect of the present invention, there is provided an integrated Peltier Seebeck panel or sheet formed by combining modules each formed by connecting a plurality of circuit systems in series or in parallel, each of the circuit systems connecting a plurality of the above-mentioned integrated parallel Peltier Seebeck element chips as claimed.

Moreover, according to still another aspect of the present invention, there are provided an integrated system for direct conversion from thermal energy to electric energy, and an integrated system for transfer of thermal energy comprising the thus-produced integrated Peltier Seebeck panels or sheets connected in series or in parallel.

BRIEF DESCRIPTION OF DRAWINGS

FIG. 1(a) is a top view, FIG. 1(b) is a left side sectional view taken across a line Y-Y', FIG. 1(c) is an upper side sectional view taken across a line X-X'.

FIG. 3(a) is a top view, FIG. 3(b) is a left side sectional view, and FIG. 3(c) is an upper side sectional view.

FIG. 4(a) is a top view, FIG. 4(b) is a left side sectional view, and FIG. 4(c) is an upper side sectional view.

FIG. 5(a) is a top view, FIG. 5(b) is a left side sectional view, and FIG. 5(c) is an upper side sectional view.

FIG. 6(a) is a top view, FIG. 6(b) is a left side sectional view, and FIG. 6(c) is an upper side sectional view.

FIG. 7(a) is a top view, FIG. 7(b) is a left side sectional view, and FIG. 7(c) is an upper side sectional view.

FIG. 8(a) is a top view, FIG. 8(b) is a left side sectional view, and FIG. 8(c) is an upper side sectional view.

FIG. 10(a) is a sectional view, FIG. 10(b) is a left side view, and FIG. 10(c) is a right side view.

BEST MODES(S) FOR CARRYING OUT THE INVENTION

The following is explanation on one example of a fabrication process or method of fabricating an Integrated Parallel Peltier Seebeck Elements (IPPS) Chip (hereinafter abbreviated to "IPPS chip"), with reference to FIGS. 1~8.

First, an amorphous silicon wafer is produced by forming, on a very thin heat resistant plastic base plate, an amorphous silicon (noncrystalline silicon) layer having a uniform thickness from several micron meters to 5 millimeters or to ten-plus-several millimeters, for example, according to usage, by vacuum evaporation, sputtering, plasma CVD (Chemical Vapor Deposition) etc. In the case of plasma CVD, for example, an amorphous silicone wafer of a uniform thickness as mentioned before is produced by growing an amorphous silicon layer on a base plate by decomposition of silane ($SiH_4$) and/or silane disilane ($SiH_6$) by glow discharge.

Alternatively, a polysilicon (polycrystalline silicon) wafer much higher in a carrier mobility of electrons and holes than the amorphous silicon is produced by performing an annealing operation by irradiation of CW (Continuous Wave) excimer laser onto an amorphous silicon layer, or by putting a wafer as a whole in an electric furnace to anneal a portion of the amorphous silicon at a high temperature. Alternatively, a monocrystalline or single crystal silicon wafer is produced by slicing an ingot formed by crystal growth of silicon in a cylindrical shape. (Hereinafter, the term "wafer" is used to represent any of the amorphous silicon wafer, polysilicon wafer and monocrystalline silicon wafer.)

A photoresist is applied thinly to a surface of the thus-prepared wafer by a coater (not shown), and a mask pattern is set to an exposure device or aligner (stepper)(not shown) provided above the wafer coated with the photoresist. Then, by this stepper, light is projected through the mask pattern on the wafer by the use of a plurality of lenses, thereby to achieve reduced projection or reduction projection for one chip on the wafer coated with the photoresist. After the exposure for one chip, exposure is repeated chip by chip by shifting the exposure stage in an up and down direction and a left and right direction until the entire surface of the wafer is scanned and exposed. Preferably, a soft or slight heat treatment called bake is performed after the exposure.

Figure 1:
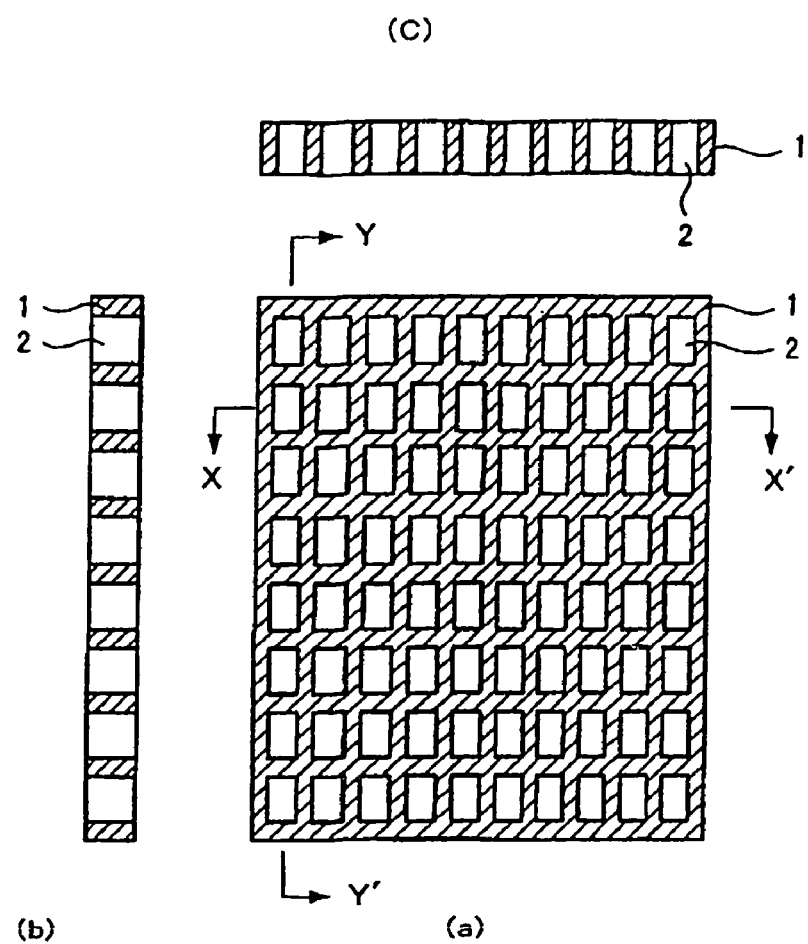
FIG. 1 shows a substrate of an insulating material such as silicon oxide or rubber, used for fabrication of an IPPS chip according to the present invention.

FIG. 1 shows a one-chip portion of the wafer on which the mask pattern is projected. FIG. 1(a) is a top view; FIG. 1(b) is a left side sectional view taken across a line Y-Y' in FIG. 1(a); and FIG. 1(c) is an upper side sectional view taken across a line X-X' in FIG. 1(a).

Figure 2:
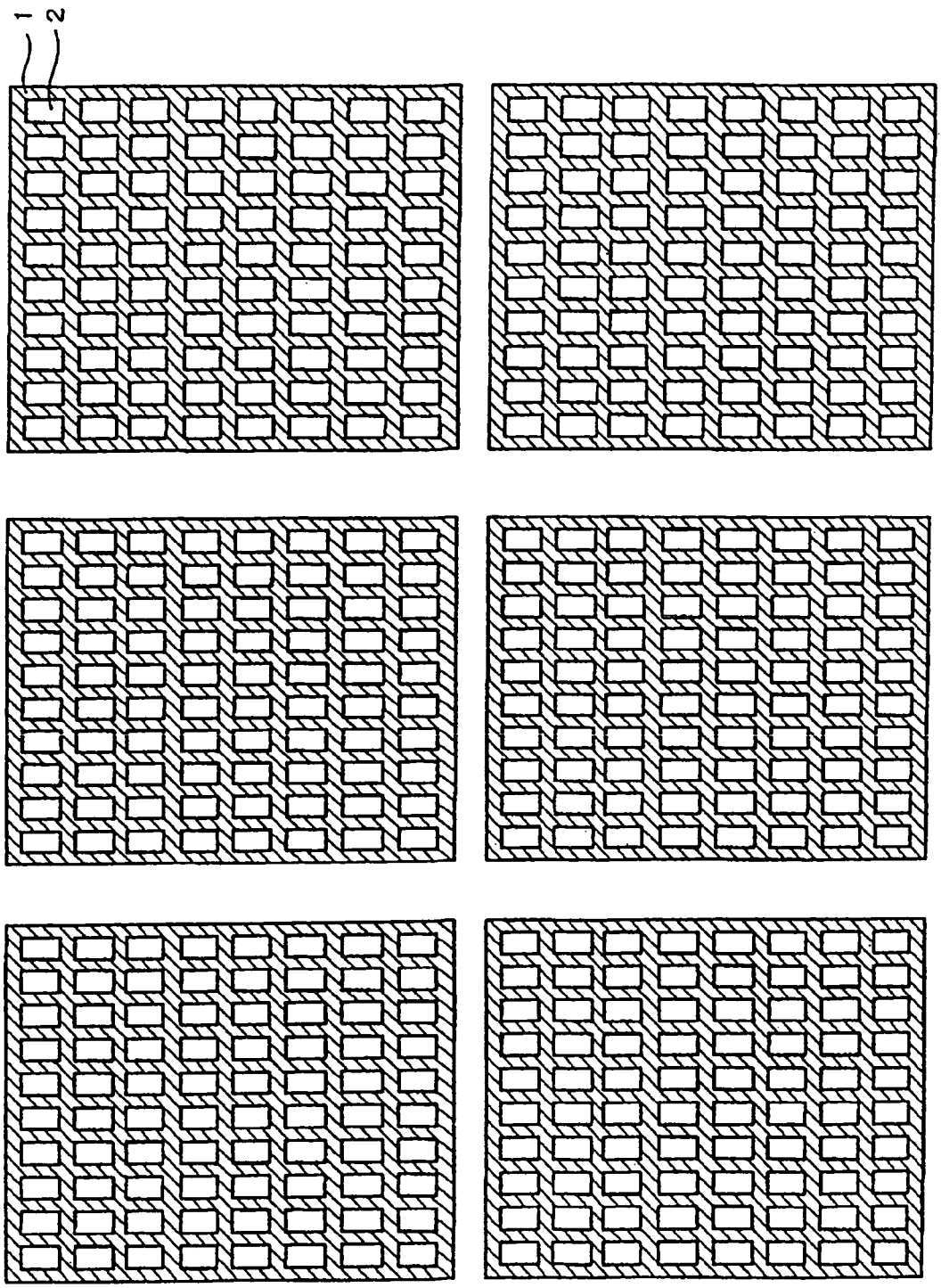
FIG. 2 is a view showing a plurality (six) of the insulating substrates shown in FIG. 1 formed in a wafer.

After the exposure to the entire wafer surface, and heat treatment in this way, development is performed. For example, the development is performed by using, as a developer liquid, a strong alkaline TMAH (tetramethyl ammonium hydroxide), and dropping this developer liquid while the wafer is spun by a developing machine (developer). In this case, the photoresist in unexposed portion or portions masked during the exposure (hatched portion 1 in FIG. 1(a)) is dissolved and removed because the photoresist is soluble by nature in an alkaline solution. On the other hand, the photoresist in white portions 2 shown in FIG. 1(a) exposed to light is made insoluble to alkali by photochemical reaction, and hence left undissolved to form a negative resist pattern. FIG. 2 is a view showing a plurality of chips as shown in FIG. 1 formed in the wafer by shifting the mask patter set in the exposure device sequentially (in the example shown in this view, six single-chip portions are formed by six exposure operations).

Then, the wafer having the negative resist is put in a high temperature oxidation furnace and oxidized into silicon dioxide ($SiO_2$) by "thermal oxidation". The thermal oxidation is a process causing a chemical reaction between silicon and oxygen in an atmosphere containing oxygen gas or steam (or water vapor). By this process, the silicon in all the hatched portions shown in FIG. 1 is changed to silicon dioxide, excluding the white portions on which the photoresist remains undissolved in each chip. By the thermal oxidation of the entire wafer formed with a plurality of chips by exposure, intervening portions formed between the chips shown in FIG. 2 are also changed to insulating portions of silicon dioxide ($SiO_2$).

Then, the alkali-insoluble negative resist is removed by a solvent from the white portions shown in FIG. 1(a). Thereafter, operations of transferring a mask pattern onto the wafer and exposing are performed by performing the exposure process and heat treatment process again. In the development in this case, the exposed portions 2 are changed by a photochemical reaction nto a chemical structure or construction soluble in an alkali solution, and the silicon surface is bared in the white portions 2 shown in FIGS. 1(a) and 2. A positive resist is left over in the remaining hatched portions 1.

Subsequently, in the case in which the amorphous silicon wafer is employed, the amorphous silicon is changed to polysilicon (polycrystalline silicon) which is much higher in carrier mobility of electrons and holes than amorphous silicon, by annealing operation of irradiation of CW excimer laser (having a wave length of 308 mm) to the white portions 2 (the portions of amorphous silicon) shown in FIG. 1(a), or by high temperature annealing operation of the amorphous silicon by heating the wafer as a whole in an electric furnace. When the polysilicon wafer or monocrystalline silicon wafer is employed instead of the amorphous silicon wafer, this process step for changing the amorphous silicon to the polysilicon can be omitted.

Figure 3:
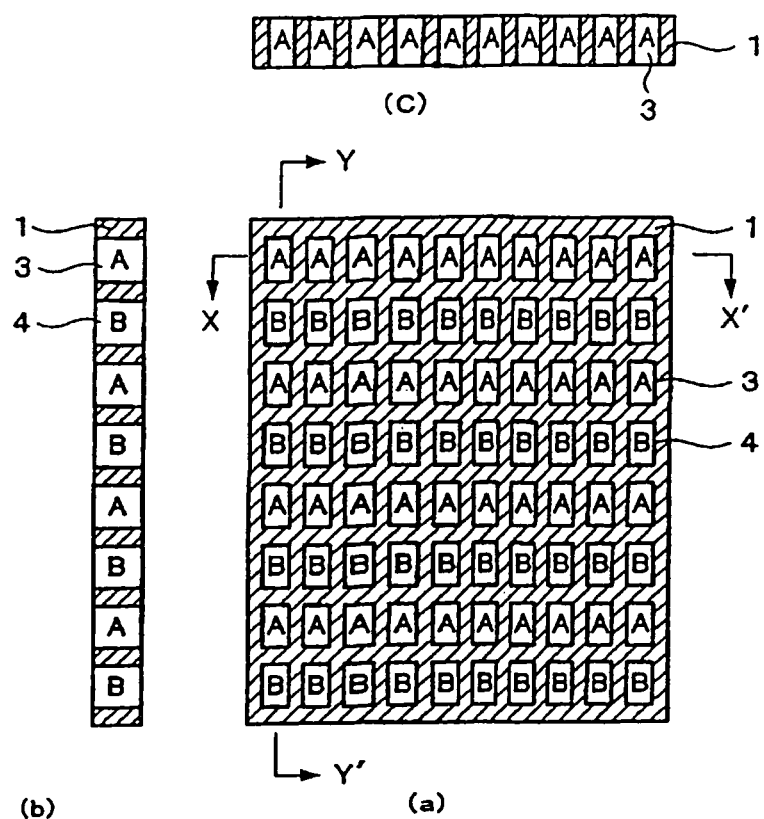
FIG. 3 shows first and second conductive members A and B formed in the process of fabricating the IPPS chip according to the present invention.

Then, as shown in FIG. 3, the white portions 2 shown in FIG. 1(a) are altered to first conductive member or part 3 and second conductive member or part 4. In this process, first, the positive resist is removed by a solvent from the hatched portions 1 other than the white portions 2 shown in FIG. 1(a), and the above-mentioned exposure process and heat treatment process are performed again. Thereafter, in order to alter A portions 3 shown in FIG. 3(a) into a p type semiconductor, transfer of mask pattern, exposure and development are performed, and ion implantation is performed, for example, by irradiating high energy ion beam of boron (B) to the A portions 3 where the silicon is bared. Therefore, boron ions are implanted into the entirety of the A portions 3 shown in FIG. 3(a) and the portions 3 are altered to the first conductive member or part A (3), that is regions of the p-type semiconductor. In the ion implantation, electron shower is applied just before ions reaches the wafer surface, and thereby plus charges of ions are neutralized by electron charges.

Lattice imperfections or defects formed by ion bombardment are repaired by annealing operation as mentioned before, and the A portions 3 of FIG. 3(a) are altered to the p-type semiconductor regions by recrystallization.

Then, in order to alter the B portions 4 of FIG. 3(a) to an n-type semiconductor, the silicon surface is bared in the B portions 4 of FIG. 3(a), and a positive resist is left to mask the other portions by a process similar to the above-mentioned boron ion beam implantation process. Then, the B portions are altered to n-type semiconductor portions of the n-type semiconductor by irradiation of high-energy ion beam of phosphorus (P), for example, and annealing.

FIGS. 3(b) and 3(c) are sectional views taken across a line Y-Y' and X-X' of FIG. 3(a), respectively, like FIG. 1.

Subsequently, the very thin heat resistant plastic base plate is removed from the lower surface of the wafer by a machine such as a polishing machine, and the A portions 3 and B portions 4 of FIG. 3(a) are bared in the lower surface of the wafer by polishing.

Then, as shown in the right side sectional view of FIG. 4(b) and the upper side sectional view of FIG. 4(c), thermal conduction terminal portions are formed by connecting the A and B portions by ohmic contact in the lower surface of the wafer with a joining member of material such as copper (first electric conductive joining member). To that end, portions each including an adjacent pair of the A portion 3 and B portion 4, and an intervening portion between the adjacent A and B portions 3 and 4 are bared in the lower surface of the wafer (a back side in FIG. 4(a)) and the other portions are masked with a positive resist, by performing transfer of a mask pattern and exposure by the above-mentioned exposure process and heat treatment process and by altering the exposed portions exposed to light into a chemical structure soluble in an alkaline solution by a photochemical reaction.

Figure 4:
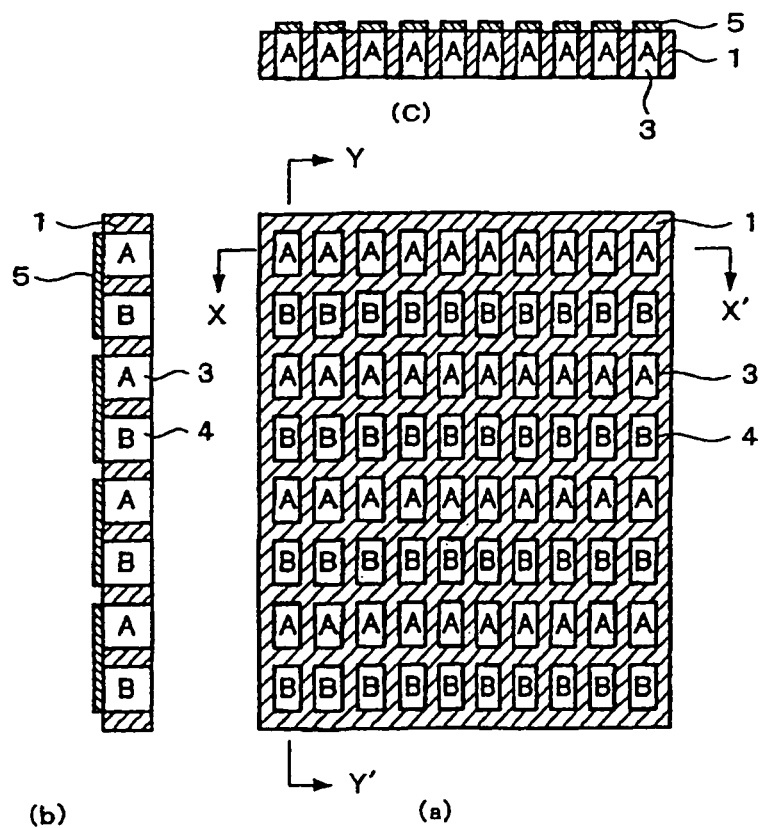
FIG. 4 shows the first and second conductive members A and B connected by ohmic contact on a lower surface of the IPPS chip in the process of fabricating the IPPS chip according to the present invention.

Then, by application (printing) of metal paste (containing powder of silver and/or copper, glass frit, resin, organic solvent etc.) to the bared portions by screen printing, and then by heat treatment, the thermal conduction terminal portions connecting the adjacent A and B portions by ohmic contact are formed by connecting the A and B portions shown in FIG. 4 on the lower surface of the wafer by ohmic contact, first by using silver paste, as the joining member 5 of silver, and then by using copper paste as the joining member 5 of copper having an appropriate thickness according to the need, by repetition of the printing of copper paste on the silver layer and heat treatment.

Then, terminal side portions of a conductive material are formed on the upper surface of the wafer by covering the A and B portions of FIGS. 4(b) and 4(c) with a joining member 6 (second electric conductive jointing member; cf. FIG. 5) of material such as copper, by ohmic contact. To that end, the A portion 3 and B portion 4 are bared and the other portions are masked with a positive resist, by performing transfer of a mask pattern and exposure by the above-mentioned exposure process and heat treatment process and by altering the exposed portions exposed to light into a chemical structure soluble in an alkaline solution by a photochemical reaction.

Figure 5:
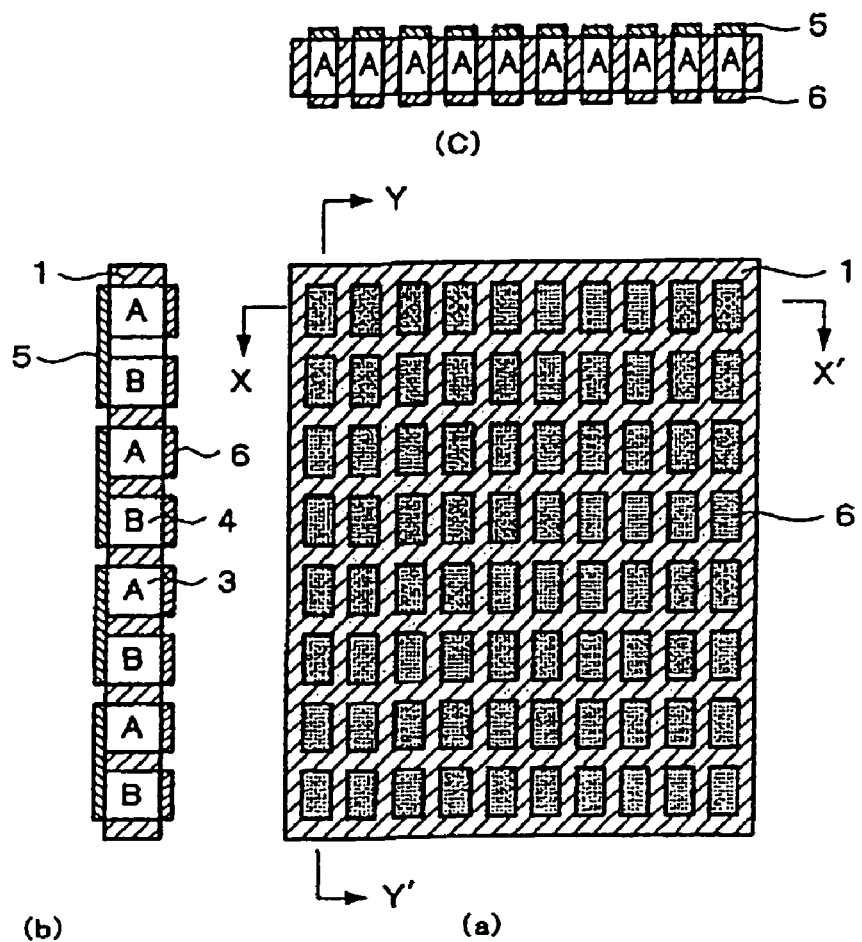
FIG. 5 shows the first and second conductive members A and B joined by ohmic contact with a conductive joining member on an upper surface of the IPPS chip in the process of fabricating the IPPS chip according to the present invention.

Then, by application (printing) of metal paste (containing powder of silver and/or copper, glass frit, resin, organic solvent etc.) to the bared A and B portions of FIG. 4(a) by screen printing and heat treatment in the same manner as the processes applied to the lower side of the wafer, the terminal side portions for the adjacent A and B conductive members 3 and 4 are formed on the upper side as shown in FIG. 5, first by using silver paste as conductive material of silver for ohmic contact, and then by using copper as the conductive member 6 of copper having an appropriate thickness according to the need, by repetition of the printing of copper paste on the silver layer and heat treatment.

Figure 6:
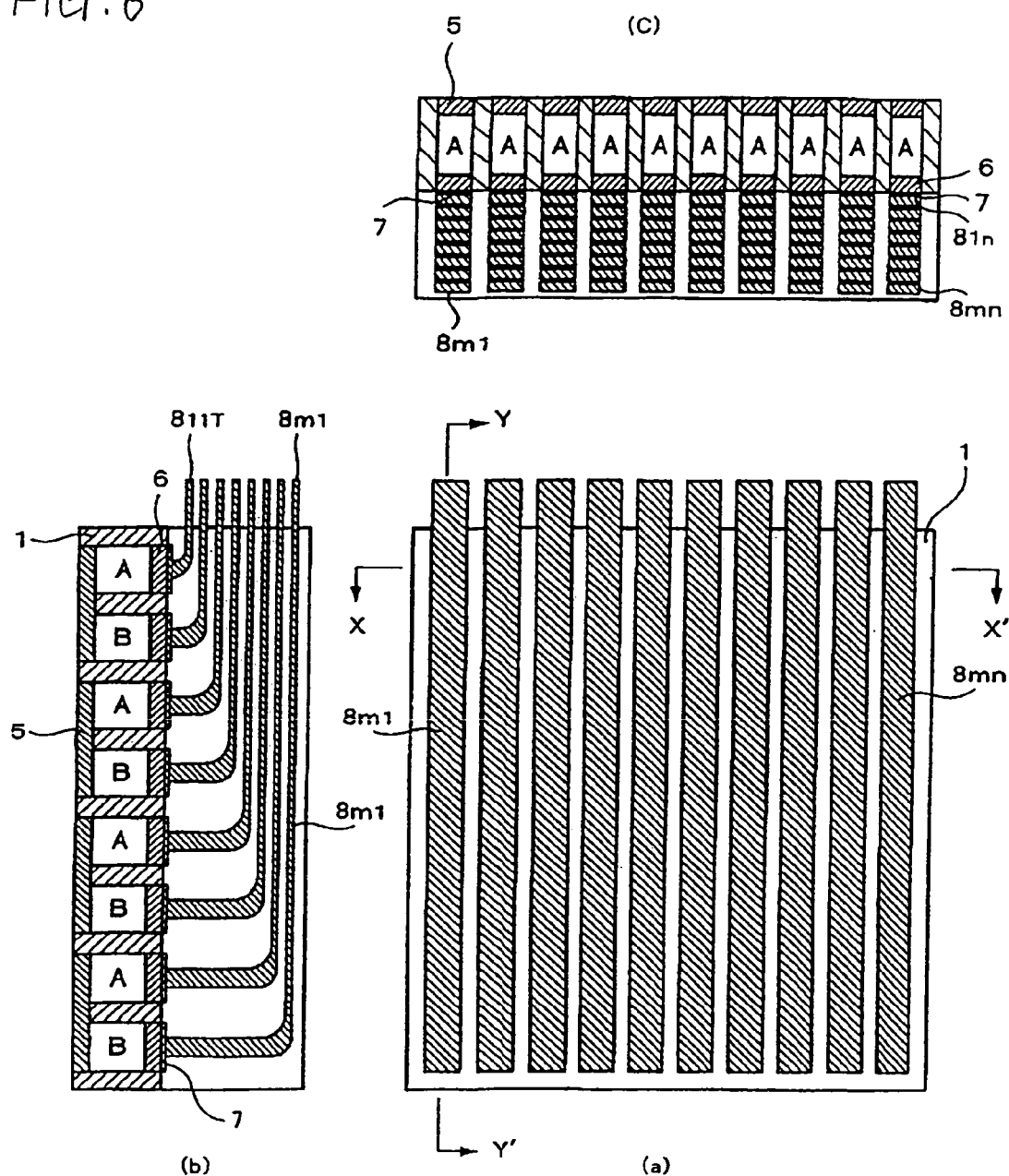
FIG. 6 shows the first and second conductive members A and B connected with bonding wires on the upper surface of the IPPS chip in the process of fabricating the IPPS chip according to the present invention.
Figure 8:
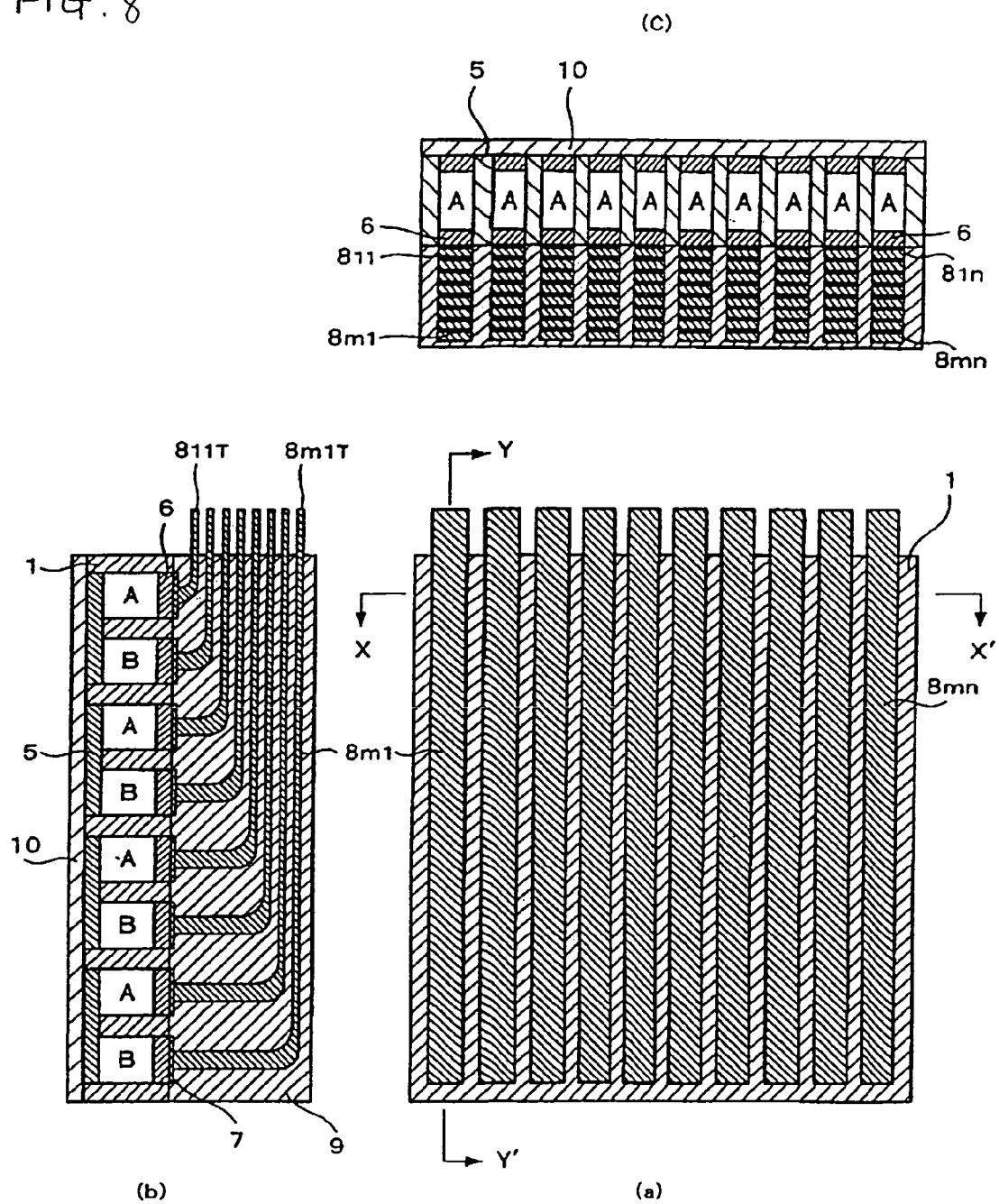
FIG. 8 shows the lower surface of the IPPS chip covered with a material conductive thermally and insulating electrically in a joint surface in the process of fabricating the IPPS chip according to the present invention.

Next, to join connecting terminal portions for connection to an external device, connecting terminal portions are formed by covering the terminal side portions 6 formed on the upper side of the chip, with a solder coating, and connecting a joining member of material such as copper electrically with each of the terminal side portions 6 in such a manner that these joining members are arranged in parallel to one another, insulated from one another, and adapted to be connected to an external device. Therefore, as shown in FIG. 6, a bonding wire 8 of electric conductive metal material, such as copper, superior in electric conductivity and thermal conductivity, having a large cross sectional area as much as possible, is connected, by pressing and heating, to the solder coating of each terminal side portion. Joining members 7 shown in FIG. 6 are joining portions each formed by an end of the bonding wire 8 flattened and spread by the pressing and heating operation in the bonding process to connect the bonding wire 8. The thus-formed joining members 7 serve to strengthen and secure the electric connection between the terminal side portions 6 and the bonding wires 8. Moreover, connection terminal portions $8_{11T} \sim 8_{mnT}$ are formed in the state in which all the bonding wires $8_{11} \sim 8_{mn}$ (the number of bonding wires is m×n: In FIG. 8, m=8, n=10 and the total number is 80.) are electrically insulated from one another.

The IPPS chips having the structure formed by the above-mentioned process could undergo damage such as breakage during use for various applications. To prevent such damage, as shown in FIG. 7, the bonding wires $8_{11} \sim 8_{mn}$ are fixed, by a molding process using an insulating material 9 which is higher in thermal conductivity and low in stress characteristic in such manner that the mutually insulated connecting terminal portions $8_{11T} \sim 8_{mnT}$ are enveloped.

Figure 7:
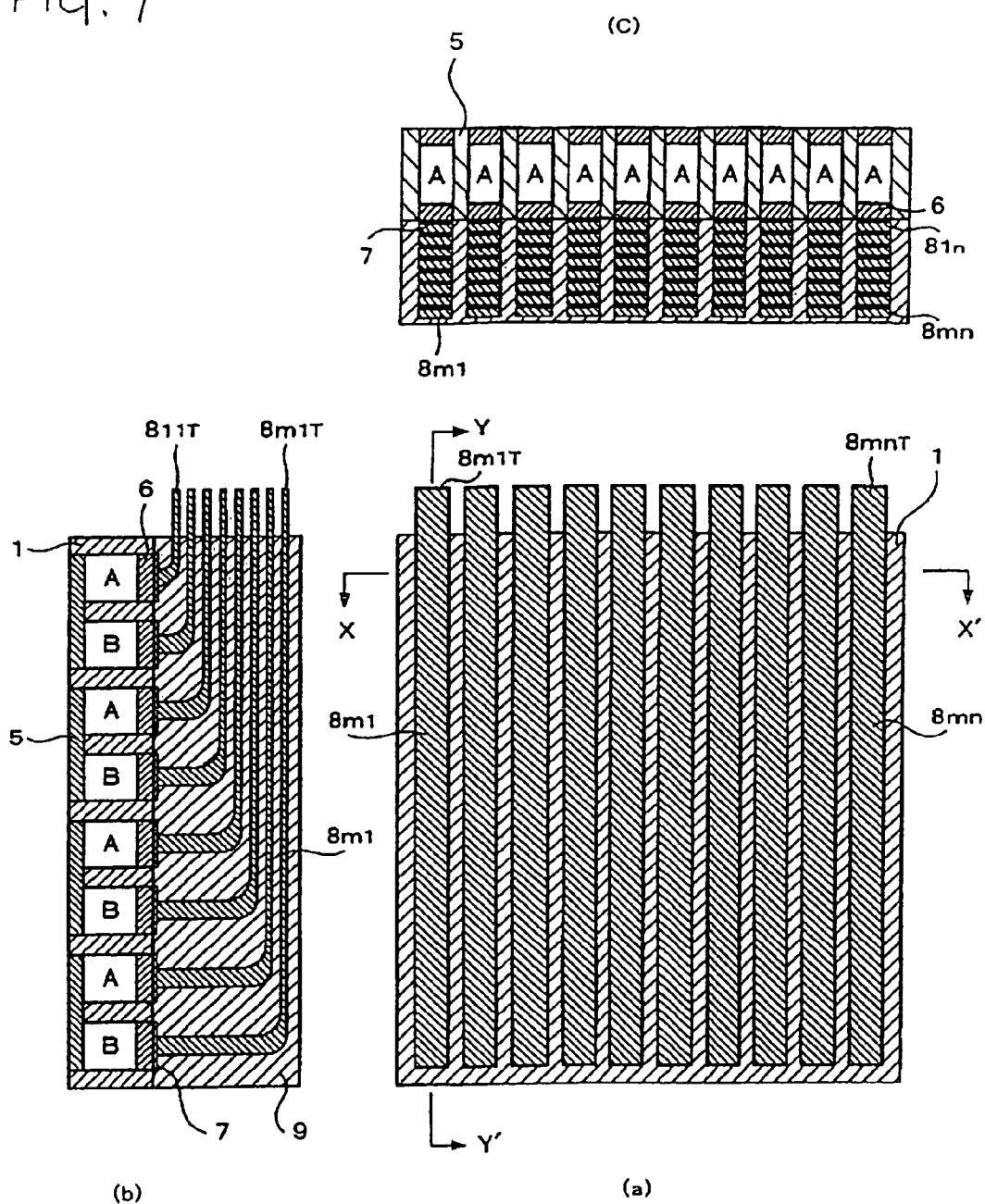
FIG. 7 shows the bonding wires of the first and second conductive members A and B molded with an insulating material on the upper surface of the IPPS chip in the process of fabricating the IPPS chip according to the present invention.

Furthermore, as shown in FIG. 8, a joining member 10 having a superior thermal conductivity and an electric insulating ability, is joined to all the thermal conduction terminal portions which are connected with the first conductive members 3 (A portions) and the second conductive members 4 (B portions) by ohmic contact and bared in the lower surface shown in FIG. 7. For example, the joining member 10 is an insulating thin plate having a good thermal conductivity, such as an aluminum plate made into an insulating plate by alumite or alunite treatment forming a very thin layer on a surface. The thus-joined thermal conductive joining member 10 can insulate the thermal conduction terminal portions on the lower surface of FIG. 8 from one another on one hand, and make the temperatures of all the first conductive members 3 of the A portions and the second conductive member 4 of the B portions, quickly to an equal or uniform level.

Although the above explanation is directed to the IPPS chip fabricating process using silicon oxide ($SiO_2$) as the insulating substrate, as an example of the first embodiment, it is possible to fabricate IPPS chips by using an insulating substrate of an insulating material having an appropriate hardness, such as silicone rubber instead of silicon oxide. In the case of the insulating substrate of the insulating material such as silicone rubber having an appropriate hardness being employed, holes to be plugged are formed in an insulating substrate by using a mask pattern to leave a photo resist of positive resist on a remaining portion other then the portions to open the holes to be plugged with the first conductive member A(3) and the second conductive member B(4). Consecutively after the formation of the holes, in the state in which the photo resist remains unremoved, an amorphous silicon layer having a uniform thickness from several micron meters to 5 millimeters or to ten-plus-several millimeters, for example, according to usage, by vacuum evaporation, sputtering, plasma CVD (Chemical Vapor Deposition) etc, and thereby a substrate (wafer) is produced in which all the holes are plugged up with the amorphous silicon. Furthermore, an annealing operation is repeated by irradiating CW excimer laser (having a wavelength of 308 mm) to the amorphous silicon portions in the holes until the amorphous silicon is changed into polysilicon. Alternatively, by irradiation of high power CW excimer laser (having a wavelength of 308 mm) for a long time, the amorphous silicon is changed into mixed silicon of polysilicon and single crystal silicon (as the regions of the monocrystalline silicon are increased, it is possible to obtain the silicon capable of enhancing the function according to the present invention with a higher carrier mobility of electrons and holes). Thereafter, by performing processes similar to the processes shown in FIGS. 1~8, it is possible to produce IPPS chips having such a characteristic that the insulating region has a flexibility or softness according to the need, and the chips are flexible to an external force, and difficult to break.

In the IPPS chip produced by the above-mentioned process, as shown in FIGS. 1~8, the first conductive members A(3) and the second conductive members B(4) different in the Seebeck coefficient are arranged alternately along lines. On the lower side shown in FIG. 8(a), the first conductive members A(3) and second conductive members B(4) are connected by the joining members 5 of copper or the like (the first conductive joining member) as shown in FIG. 8(b). On the upper side of FIG. 8(a), the first conductive members A(3) and second conductive members B(4) are connected, respectively, with the joining members 6 (the second conductive joining member) of copper or the like. The joining members 6 are further connected with the bonding wires 8 of metallic conductive material such as copper, and their pressed wire end conductive members 7 by ohmic contact.

The bonding wires are equal in number to the number of the first conductive members A(3) and second conductive member B(4). Namely, the bonding wires $8_{11}$~$8_{mn}$ are taken out in parallel to one another. These bonding wires are insulated from one another, and the thus-formed connection terminal portions $8_{11T}$~$8_{mnT}$ are taken out in parallel to one another. Moreover, as shown in FIGS. 8(b) and 8(c), the chip is held in the state having a good thermal conductivity as a whole of the chip, by joining the thermally conductive and electrically insulating thin joining member 10 such as a thin aluminum plate having the electric insulating properties on the joint surfaces by alumite process or the like.

Figure 9:
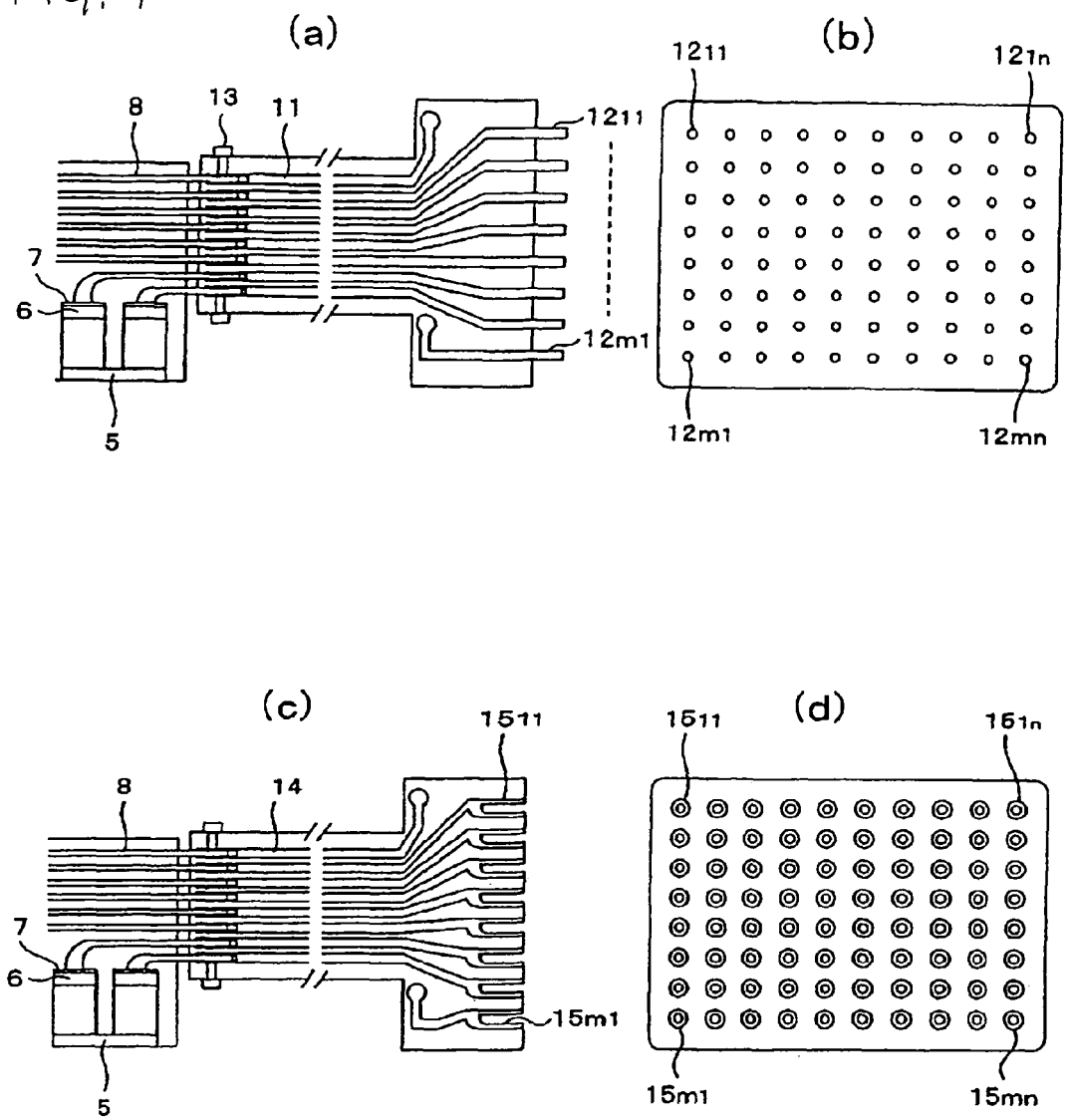
FIGS. 9(a) and 9(b) show an example of a male serial cable used in the present invention.
FIGS. 9(c) and 9(d) show an example of a female serial cable used in the present invention.
Figure 10:
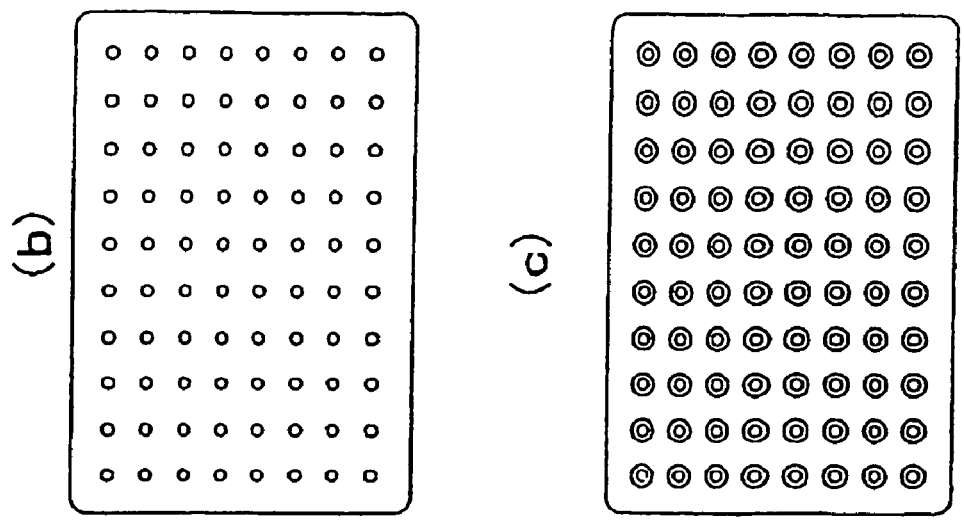
FIG. 10 shows an example of a male type, female type parallel cable.
Figure 10:
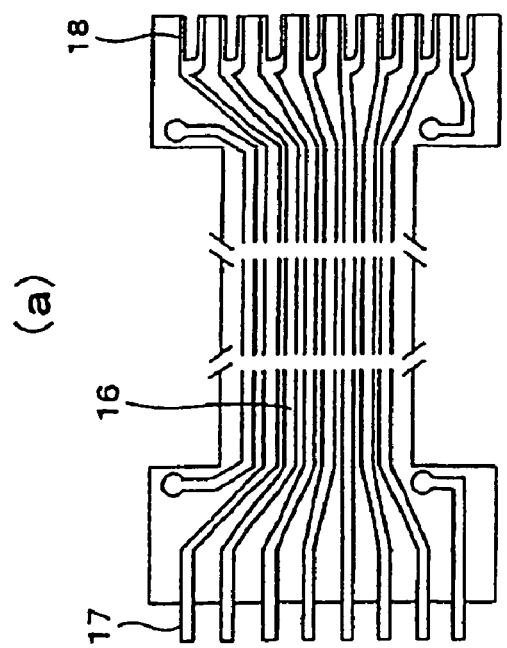

The following is explanation on an example of a process of connecting a plurality of IPPS chips produced by the above-mentioned process, using FIGS. 9 and 10.

FIGS. 9(a) and 9(b) show an example of a male type serial cable. FIG. 9(a) is a sectional view showing a connected state of an IPPS chip and a male type, multi-terminal connector, and FIG. 9(b) is a front view of the male terminal portion. Similarly, FIGS. 9(c) and 9(d) show an example of a female type serial cable. FIG. 9(c) is a sectional view showing a connected state of an IPPS chip and a multi-terminal connector of a female type serial cable 11, and FIG. 9(d) is a front view of the female terminal portion.

As shown in FIG. 9(a), the bonding wires $8_{11}$~$8_{mn}$ are inserted into one terminal surface of a male type serial cable 11 and fixed by one or more screw fasteners 13. From the other terminal surface of the male connector cable 11, male terminals $12_{11}$~$12_{mn}$ project in a mutually insulated state. FIG. 9(c) shows a female type serial cable 14 connected with an IPPS chip. The opposite terminal surface is formed with female terminals $15_{11}$~$15_{mn}$. In the other respects, the construction of FIG. 9(c) is the same as that of FIG. 9(a).

FIG. 10 shows a male female type parallel cable. A parallel cable 16 shown in FIG. 10 includes a group of male terminals 17 at one end and a group of female terminals 18 at the other end.

As evident from FIGS. 9(a) and 9(c), each of the male and female serial cables 11 or 14 has the terminals equal in number to the number m×n of the terminals $8_{11T}$~$8_{mnT}$ of the IPPS chip surface. The parallel cable 16 which can serve as an extension cable has the male terminals 17 and female terminals 18 at both ends as shown in FIG. 10. Besides the parallel cable having the male and female terminals at both ends as shown in FIG. 10, there are options such as a multi-terminal connector having a cable including male terminals at both ends, or having a cable including female terminals at both ends. The parallel cable 15 can be prepared by using a cable of a desired length according to the need.

A plurality of IPPS chips are connected by one or more serial or parallel cables including one or more multi-terminal connectors as shown in FIGS. 9 and 10 so as to form a circuit system of a series configuration. With this configuration, it is possible to realize a circuit system used for a direct conversion system for direction conversion from thermal energy to electric energy.

Figure 11:
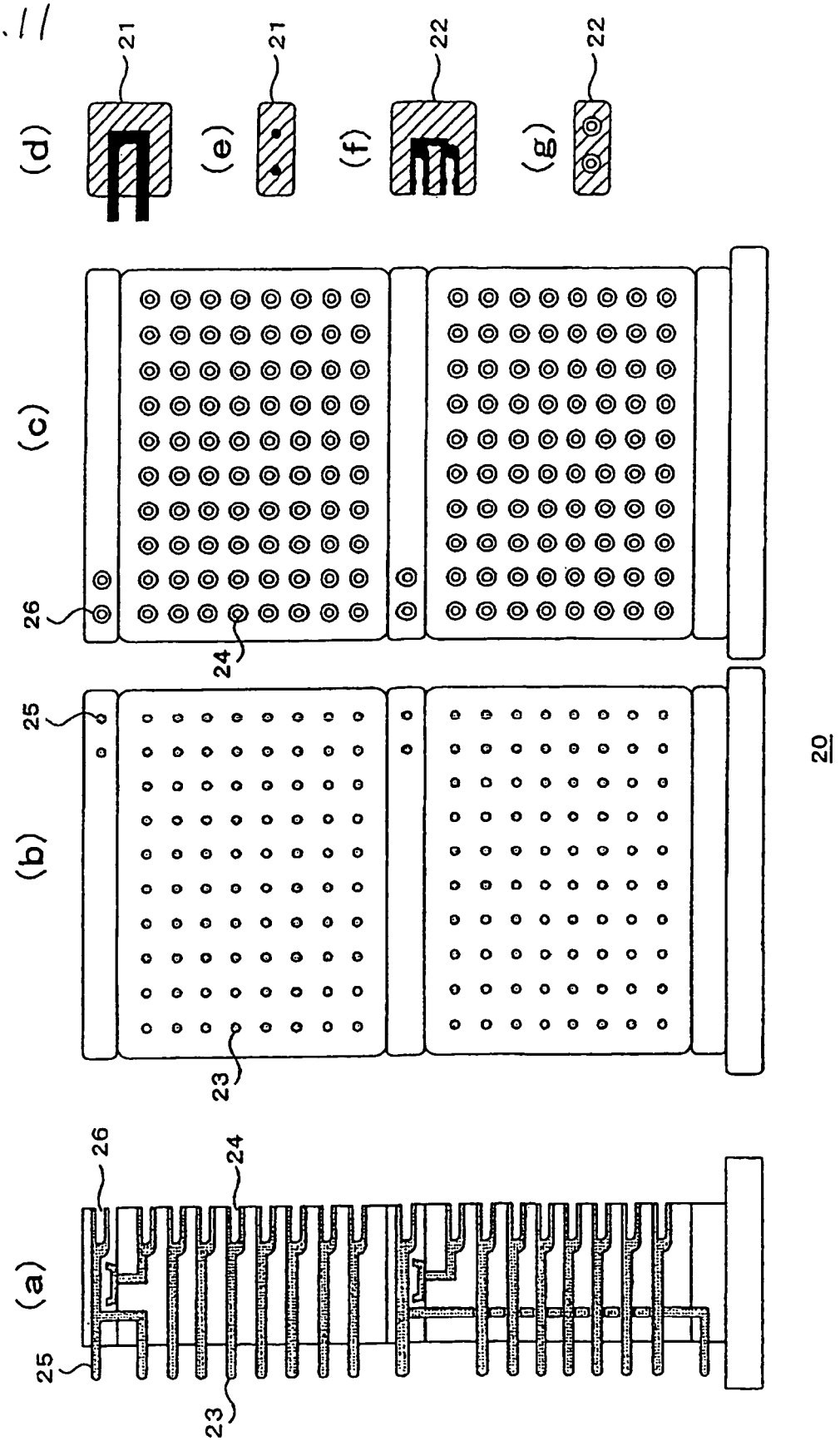
FIGS. 11(a), 11(b) and 11(c) are sectional view, left side view and right side view of an integrated connector tap.
FIGS. 11(d) and 11(e) are sectional view and left side view of a two terminal male short-circuit terminal.
FIGS. 11(f) and 11(g) are sectional view and left side view of an example of a two terminal female short-circuit terminal.

FIG. 11 is used for illustrating an example of an integrated connector tap 20 for connection of the above-mentioned male type or female type serial cable or cables. FIGS. 11(a)~11(g) show an example of the integrated connector tap 20 and short-circuit terminals 21, 22. FIG. 11(a) is a sectional view as if cut at a two terminal portion for connection to an external circuit. FIG. 11(b) is a left side view of the left side shown in FIG. 11(a), and FIG. 11(c) is a right side view of the same. This integrated connector tap includes a male type, multi-terminal connector 23 on the left side, and a female type, multi-terminal connector 24 on the right side. Moreover, in order to make connection to an unshown two terminal external circuit, there are provided, on the left side surface and right side surface of integrated connector tap 20, a left and right pair of male type two terminal connector 25 and female type two terminal connector 26.

The left side surface of this integrated connector tap 20 is connected with one or more female type serial cables or parallel cables as shown in FIG. 9(c), and the right side surface is connected with one or more male type serial cables or parallel cables as shown in FIG. 9(a). In one example, an upper half of the integrated connector tap shown in FIGS. 11(a), 11(b) and 11(c) is connected the serial cable (cf. FIG. 9(c)) having the female type multi-terminal connector on the left side, and the parallel cable having the male type multi-terminal connector on the right side (cf. FIG. 10). A lower half of the integrated connector tap 20 shown in FIGS. 11(a), 11(b) and 11(c) is connected the parallel cable (cf. FIG. 10)) having the female type multi-terminal connector on the left side, and the serial cable having the male type multi-terminal connector on the right side (cf. FIG. 9(a)).

Thus, by using the integrated connector tap 20, it is possible to connect serial cables equipped with multi-terminal connectors with each other or to connect a serial cable and a parallel cable appropriately according to the need for usage. Moreover, for example, by constructing an integrated system for direct conversion of thermal energy to electric energy in which the thermal conduction terminal portion's side of a first IPPS chip is set in a high temperature section, and the thermal conduction terminal portion's side of a second IPPS chip is set in a low temperature section, it is possible to supply generated electric power to an unshown external circuit through male type and female type two terminal connectors. For example, power can be supplied by using a female type two terminal connector for a male type two terminal external circuit, and by connecting a male type two terminal connector in the case of a female type two terminal external circuit. Furthermore, when a circuit system formed by joining or connecting two or more IPPS chips in series is used for transfer of thermal energy, in order to supply electric current to this system from an external circuit, a female type two terminal connector is used for a male type two terminal external circuit. For a female type two terminal external circuit, external current is supplied by connecting a male type two terminal connector.

Moreover, in the case of construction of larger-scale integrated system for direct conversion from thermal energy to electric energy, integrated system for transfer of thermal energy or mixed integrated system having a mixed configuration of these two systems, it is possible to readily complete a system exempt from mistaken connection by short-circuiting the male type two terminals 25 or female type two terminals 26 of the integrated connector tap 20 by the use of a male type short-circuit terminal 21 shown in FIGS. 11(d) and 11(e), or a female type short-circuit terminal 22 shown in FIGS. 11(f) and 11(g) so as to make the integrated system, as a whole, a closed circuit.

In a current supply source from an external circuit, it is possible to employ one of the following three modes. A first mode is a mode utilizing an electric power source of an external circuit. A second mode is a mode utilizing, as a power source of its own, power generated by a constructed system, or utilizing, as a power source, power generated by one or more separate systems constructed independent from this system. The former case is equivalent to a system in which all the two terminal connectors are short-circuited by terminals for short circuiting. In this case, since a current due to Seebeck electromotive force utilizing a temperature difference acts endothermically by the Peltier effect in a high temperature section and acts exothermically in a low temperature section, thermal energy is transferred electronically by free electrons in conductor, and heat transfer is promoted in the form other than heat conduction in the conductor of the circuit. On the other hand, the latter case corresponds to a self-drive type heat transfer system utilizing only temperature difference thermal energy without using substantial external power as a whole.

A third mode is a mode using electric power generated by a system constructed, as a power source of an external circuit, or using, in combination, electric power generated by one or more separate systems constructed independent from this system. In other words, the system using power generated by a system constructed as a power source of an external circuit is equal to an automatic system for saving energy by returning Seebeck electromotive force based on the use of a temperature difference to the power source of the external circuit. The mode of constructing one or more separate systems independent of this system and using, in combination, electric power generated by these systems results in an external power energy saving system positively using electromotive force based on the use of temperature difference thermal energy, and it is possible to realize a self drive type heat transfer system making the most use of this aspect.

Figure 12:
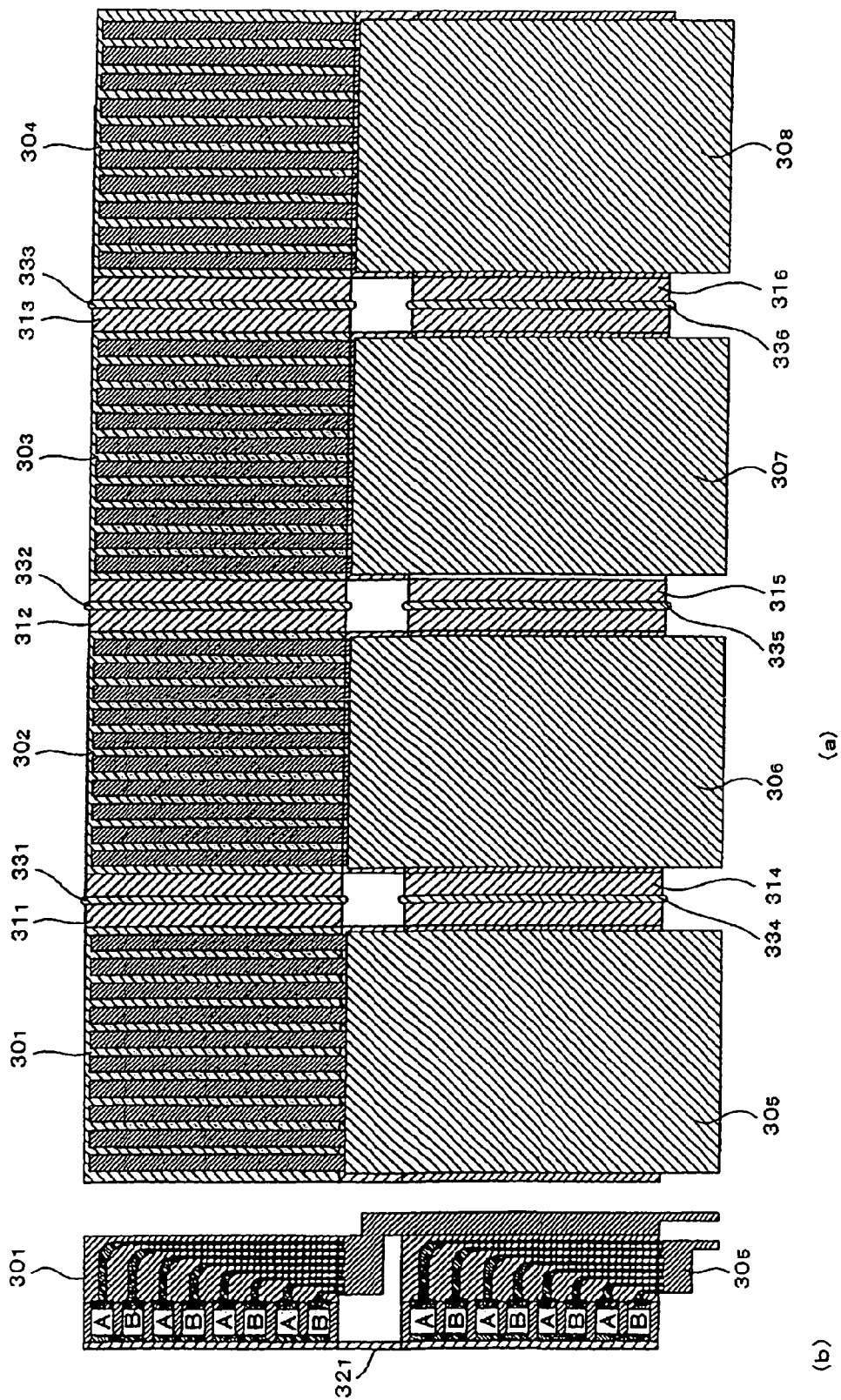
FIG. 12 is a view showing an example of a module connecting IPPS chips with joining material.
Figure 13:
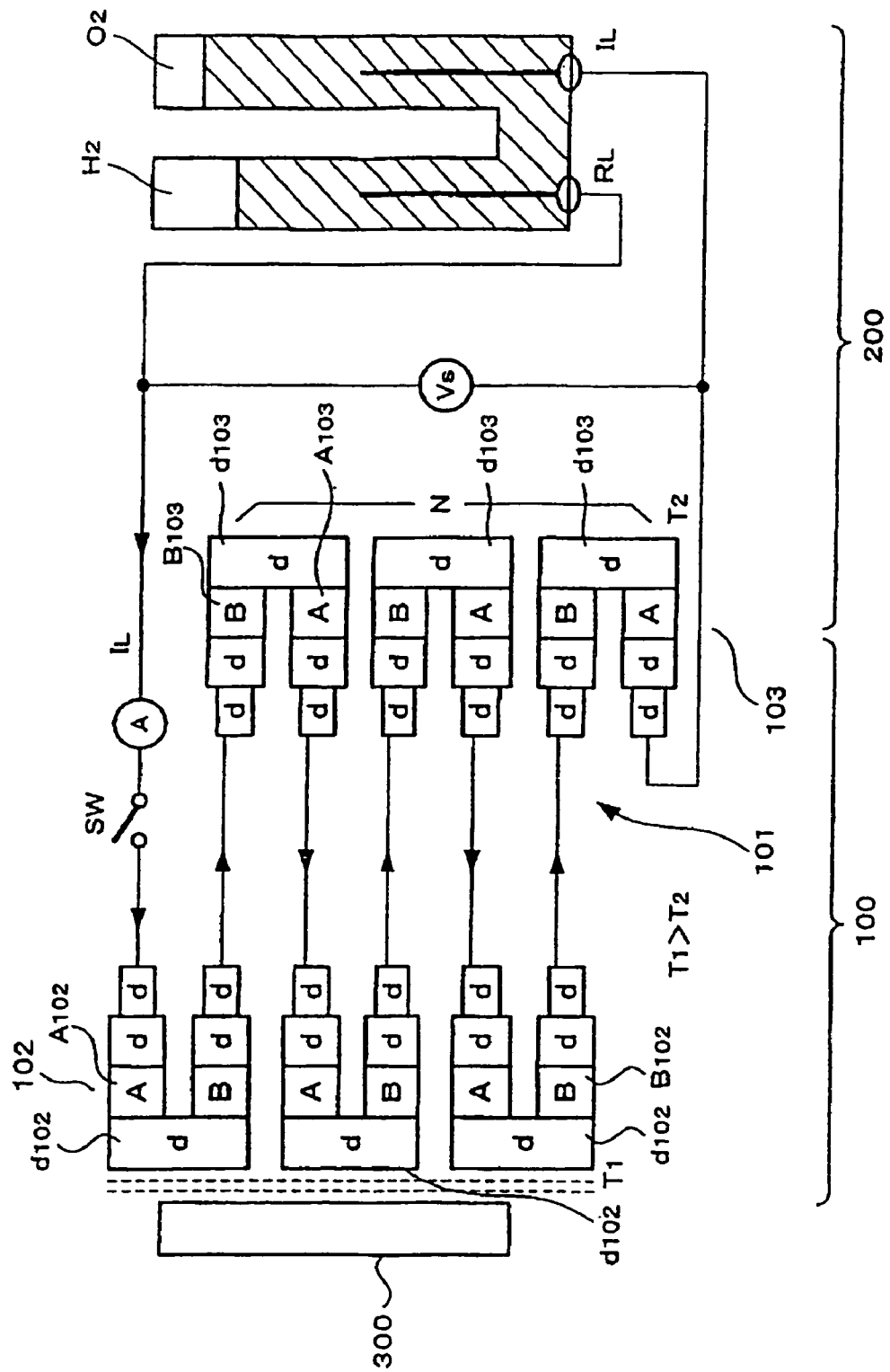
FIG. 13 is a schematic view of a self drive heat transfer system for illustrating an energy direct conversion system using conventional thermo electric effect devices.

Finally, on the basis of FIG. 12, explanation is directed to an example of panel-shaped apparatus integrated into a desired size according to the need by combining a plurality of modules each formed by connecting, in series, a plurality of circuit systems each produced by joining or connecting a plurality of IPPS chips according to the present invention in series or in parallel.

FIG. 12 shows, as an example, a module formed integrally in the shape of a panel, by connecting IPPS chips $30_1$~$30_8$ according to the present invention, in an arrangement of two in a vertical direction and four in a lateral direction. As shown in FIG. 12, IPPS chips $30_1$ and $30_2$; $30_2$ and $30_3$; and $30_3$ and $30_4$ are connected by first connecting portions $31_1$, $31_2$ and $31_3$, respectively, so that the chips are electrically insulated from each other. In the same manner, IPPS chips $30_5$ and $30_6$; $30_6$ and $30_7$; and $30_7$ and $30_8$ are connected by first connecting portions $31_4$, $31_5$ and $31_6$, respectively.

IPPS chips $30_1$ and $30_5$; $30_2$ and $30_6$; $30_3$ and $30_7$; and $30_4$ and $30_8$ are connected by second connecting portions $32_1$~$32_4$ (only $32_1$ is shown), respectively, so that the chips are electrically insulated from one another. The module is formed as an integral unit by joining or connecting these IPPS chips $30_1$~$30_8$ in series. Furthermore, a panel or sheet having a desired size according to the need is formed by combining a plurality of the modules. By using, as materials of the first and second connecting portions, rigid or hard material such as metal and plastic, it is possible to produce an integrated Peltier Seebeck (IPS) Panel (hereinafter referred to as "IPS panel") in which IPPS chips are expanded and united in a flat form.

Moreover, by using, as materials of the first and second connecting portions, durable flexible or soft material such as rubber or vinyl material, or hinge-shaped movable members $33_1$~$33_6$ provided between connecting portions of rigid material, it is possible to assemble a flexible sheet bent into a shape similar to a cylindrical shape. The thus-assembled collection of IPPS chips in the form of a single unit is called Integrated Peltier Seebeck (IPS) sheet (hereinafter abridged as "IPS sheet"). The thus-constructed IPS sheet can be used for various situations and various purposes in various forms. For example, it is possible to utilize hot water of a hot spring as a source of heat, by bending an IPS sheet in a hollow cylindrical shape and immersing the IPS sheet in hot water.

As explained above, small, middle and large sized integrated IPS panels or sheets can be produced by connecting IPS panels or sheets in series or in parallel.

The integrated IPS panels or sheets can be used, instead of the IPPS chips, as components for constructing an integrated system, and therefore can be used for integrated systems for direct conversion from thermal energy to electric energy and integrated systems for transfer of thermal energy.

It is possible to enhance the efficiency of utilization of solar energy significantly by collecting approximately 100% of solar energy by black body absorption by making the surface of a conventional solar panel black or nonreflective, by converting photoenergy into electric power by photovoltaic effect, and converting heat energy into electricity by suing an integrated system according to the present invention.

The integrated parallel Peltier Seebeck element chip fabricating process according to the present invention can significantly reduce the time required for fabrication conventionally performed by skilled technician or technicians, by applying the LSI fabricating technique to the integrated Peltier Seebeck element chip fabricating process.

Moreover, a multitude of integrated parallel Peltier Seebeck element chips are formed simultaneously, and multi terminal connectors are provided. Therefore, integrated Peltier Seebeck panels and sheets can be produced by a simple method by combining the integrated parallel Peltier Seebeck element chips. Consequently, it is possible to assemble an integrated system for direct conversion from thermal energy to electric energy and an integrated system for transfer of thermal energy, by incorporating the Peltier Seebeck panel or panels or sheet or sheets very quickly.

Although explanation has been given about the IPPS chip fabricating process according to the invention, the structure of the IPPS chip, and the structure and production method of the IPS panel or sheet, the invention is not limited to the embodiments described above. Various forms and modifications are included as long as they are not deviated from the gist of the invention.

The invention claimed is:

1. An integrated parallel Peltier Seebeck element chip comprising:
    a plurality of adjacent pairs, each adjacent pair including a first silicon semiconductive portion and a second silicon semiconductive portion which have different Seebeck coefficients and are formed in an insulating substrate having a first substrate surface and a second substrate surface opposite to the first substrate surface, each of the first and second silicon semiconductive portions extending through the insulating substrate from the first substrate surface to the second substrate surface;
    a plurality of thermal conduction terminal portions, wherein each of the thermal conduction terminal portions connects, by ohmic contact, the first and second silicon semiconductive portions of one of the adjacent pairs on the first substrate surface;
    a plurality of terminal side portions, wherein each terminal side portion covers, by ohmic contact, only one of the adjacent first and second silicon semiconductive portions of the adjacent pairs on the second substrate surface; and a plurality of conducting wires, wherein each of the conducting wires is electrically connected with only one of the terminal side portions.

2. The integrated parallel Peltier Seebeck element chip as claimed in claim 1, wherein the conducting wires extend along the second substrate surface in a plurality of regions so that each region includes a plurality of the conducting wires extending in a direction from a first side to a second side of the element chip, and the conducting wires terminate at respective connection terminal portions formed at the second side of the element chip.

3. The integrated parallel Peltier Seebeck element chip as claimed in claim 1, wherein the Peltier Seebeck element chip includes a plurality of thermoelectric elements that each include one of the adjacent pairs of the first and second silicon semiconductive portions, wherein the thermal conduction terminal portions and the terminal side portions do not electrically connect the thermoelectric elements.

4. An integrated parallel Peltier Seebeck element chip comprising:
   first and second silicon semiconductive members having different Seebeck coefficients formed in a plurality of rectangular unoxidized portions formed in an insulating substrate in a form of a lattice-shaped array corresponding to a mask pattern;
   a plurality of adjacent pairs, each adjacent pair including one of the first silicon semiconductive members and an adjacent one of the second silicon semiconductive members;
   a plurality of first conductive joining members, wherein each of the first conductive joining members connects, by ohmic contact, surfaces of the adjacent first and second silicon semiconductive members of one of the adjacent pairs on a first side to form a thermal conduction terminal portion;
   a plurality of second conductive joining members, wherein each of the second conductive joining members covers, by ohmic contact, surfaces of only one of the adjacent first and second silicon semiconductive members of one of the adjacent pairs on a second side, wherein said second side is opposite to the first side to form terminal side portions for the first and second silicon semiconductive members; and
   a plurality of third conductive joining members, each of the third conductive joining members directly electrically connected with only one of the second conductive joining members, wherein the plurality of third conductive joining members are arranged in parallel to one another, insulated electrically from one another, and configured to be connected to an external circuit, each of the first and second silicon semiconductive members being connected with only one of the third conductive joining members.

5. An integrated Peltier Seebeck panel or sheet comprising a combination of modules each formed by connecting a plurality of circuit systems in series or in parallel, each of the circuit systems connecting a plurality of the integrated parallel Peltier Seebeck element chips as claimed in claim 4.

6. An integrated system for direct conversion from thermal energy to electric energy, comprising a plurality of the integrated Peltier Seebeck panels or sheets recited in claim 5 which are connected in series or in parallel.

7. An integrated system for transfer of thermal energy, comprising a plurality of the integrated Peltier Seebeck panels or sheets recited in claim 5 which are connected in series or in parallel.

8. The integrated parallel Peltier Seebeck element chip as claimed in claim 4, wherein the integrated parallel Peltier Seebeck element chip further comprises a plurality of connection terminal portions which extend straight in parallel to each other and are adapted to connect each of the first and second silicon semiconductive members with the external circuit through only one of the third conductive joining members.

9. The integrated parallel Peltier Seebeck element chip as claimed in claim 4, wherein the Peltier Seebeck element chip includes a plurality of thermoelectric elements that each include one of the adjacent pairs of the first and second silicon semiconductive members, and the first conductive joining member and the second conductive joining member do not electrically connect the thermoelectric elements.

10. An integrated parallel Peltier Seebeck element chip fabricating process comprising:
    a first step of forming, in an insulating substrate including a first substrate surface and a second substrate surface which is opposite to the first substrate surface, first and second silicon semiconductive members having different Seebeck coefficients, wherein the first silicon semiconductive members and the second silicon semiconductive members are arranged alternately in the insulating substrate, and each of the first silicon semiconductive members and the second silicon semiconductive members extends through the insulating substrate from the first substrate surface to the second substrate surface;
    a second step of forming, on the first substrate surface, a plurality of first conductive joining members, wherein each first conductive joining member connects, by ohmic contact, one of the first silicon semiconductive members and an adjacent one of the second silicon semiconductive members to form a thermal conduction terminal portion;
    a third step of forming, on the second substrate surface, a plurality of second conductive joining members, wherein each second conductive joining member covers, by ohmic contact, only one of the first and second silicon semiconductive members to form terminal side portions; and
    a fourth step of forming a plurality of third conductive joining members, wherein each of the third conductive joining members are directly electrically connected with only one of the second conductive joining members.

11. The integrated parallel Peltier Seebeck element chip fabricating process as claimed in claim 10, wherein the third conductive joining members formed by the fourth step include conducting wires which extend along the second substrate surface in a plurality of regions so that each region includes a plurality of the conducting wires extending in a direction from a first side to a second side of the element chip, and which terminate at respective connection terminal portions formed at the second side of the element chip.

12. The integrated parallel Peltier Seebeck element chip fabricating process as claimed in claim 10, wherein the first step of forming the first and second silicon semiconductive members comprises:
    a substep of preparing a silicon substrate;
    a substep of forming a plurality of unoxidized portions in the silicon substrate by using a mask pattern;
    a substep of altering a remaining portion other than the unoxidized portions into silicon dioxide by using photoresist, and thereby forming the insulating substrate; and a substep of altering the unoxidized portions formed in the substrate, into the first and second silicon semiconductive members having the different Seebeck coefficients.

13. The integrated parallel Peltier Seebeck element chip fabricating process as claimed in claim 10, wherein the first step comprises:
   a substep of forming holes in the insulating substrate by using a mask pattern; and
   a substep of filling, with a semiconductive material, the holes, and altering the semiconductive material in the holes into the first and second silicon semiconductive members having the different Seebeck coefficients.

14. The integrated parallel Peltier Seebeck element chip fabricating process as claimed in claim 10,
   wherein the first step of forming the first and second silicon semiconductive members includes:
      a substep of forming an even number of holes in the insulating substrate by using a mask pattern;
      a substep of forming a plurality of chips, with each of the chips being formed with the even number of holes, by shifting the mask pattern over the substrate;
      a substep of filling the holes with a semiconductive material; and
      a substep of altering the semiconductive material in adjacent two of the holes into first and second silicon semiconductive members having the different Seebeck coefficients;
   wherein the integrated parallel Peltier Seebeck element chip fabricating process further includes a step of repeating the first, second, third and fourth steps for each chip, sequentially a number of times, over an entire surface of the insulating substrate so that a plurality of chips are formed simultaneously.

15. The integrated parallel Peltier Seebeck element chip fabricating process as claimed in claim 14, wherein a plurality of the thermal conduction terminal portions each connected by ohmic contact with the first and second silicon semiconductive members of the integrated parallel Peltier Seebeck element chip are all joined with a material which is thermally conductive and electrically insulating so that the thermal conduction terminal portions are electrically insulated from one another, and arranged to quickly equalize temperatures of all the thermal conduction terminal portions of the first and second silicon semiconductive members.

16. An integrated parallel Peltier Seebeck element chip fabricating process comprising:
   a step of cutting off a plurality of integrated parallel Peltier Seebeck element chips formed by the fabricating process claimed in claim 14, individually with a cutter to provide individually cut off integrated parallel Peltier Seebeck element chips;
   a step of attaching connection terminals by electrically connecting metal lead wires, which are electrically and thermally conductive, to connection terminals formed in a surface of each cut off integrated parallel Peltier Seebeck element chip;
   a step of molding an insulating material in a form in which the metal lead wires are taken out in parallel, the metal lead wires are insulated by the insulating material from one another, and only connection terminal portions are projected out of the insulating material to make connection to an external circuit provided outside the integrated parallel Peltier Seebeck element chips; and
   a step of connecting, to make a series or parallel Peltier Seebeck circuit system, two of the integrated parallel Peltier Seebeck element chips.

17. An integrated parallel Peltier Seebeck element chip fabricating process comprising:
   a step of preparing a silicon substrate having a uniform thickness, the silicon substrate being one of an amorphous silicon substrate, a polycrystalline silicon substrate and a monocrystalline silicon substrate;
   a step of forming a plurality of chips by transferring, on the silicon substrate, a mask pattern to leave an even number of unoxidized portions in each chip;
   a step of causing a chemical reaction with oxygen by putting, in an oxidation furnace, the substrate formed with a negative resist for the unoxidized portions corresponding to the mask pattern, altering a remaining portion other than the portions corresponding to the mask pattern into silicon dioxide, and thereby forming the substrate in which the remaining portion of the substrate other than the unoxidized portions is altered as a whole into an electrical insulating material;
   a step of altering adjacent two of the unoxidized portions formed in one chip in the substrate, respectively, into first and second conductive members having different Seebeck coefficients;
   a step of forming a thermal conduction terminal portion by connecting, by ohmic contact, surfaces of the adjacent first and second conductive members on one side with a first conductive joining member;
   a step of forming terminal side portions for the first and second conductive members by covering surfaces of the first and second conductive members on an opposite side opposite to the side on which the first conductive joining member is provided, with a second conductive joining member by ohmic contact;
   a step of connecting a plurality of third conductive joining members electrically with the terminal side portions of the first and second conductive members, respectively, and forming connecting terminal portions for connection to an external circuit in a state in which the third conductive joining members are arranged in parallel to one another, and insulated electrically from one another; and
   a step of repeating the above-mentioned steps for one chip, sequentially a number of times, over an entire surface of the substrate of the insulating material so that a plurality of chips are formed simultaneously.

18. The integrated parallel Peltier Seebeck element chip fabricating process as claimed in claim 17, wherein a plurality of the thermal conduction terminal portions each connected by ohmic contact with the first and second conductive members of the integrated parallel Peltier Seebeck element chip are all joined with a material which is thermally conductive and electrically insulating so that the thermal conduction terminal portions are electrically insulated from one another, and arranged to quickly equalize temperatures of all the thermal conduction terminal portions of the first and second conductive members.

19. An integrated parallel Peltier Seebeck element chip fabricating process comprising:
   a step of cutting off a plurality of integrated parallel Peltier Seebeck element chips formed by the fabricating process claimed in claim 18, individually with a cutter to provide individually cut off integrated parallel Peltier Seebeck element chips;
   a step of attaching connection terminals by electrically connecting metal lead wires, which are electrically and thermally conductive, to connection terminals formed in a surface of each cut off integrated parallel Peltier Seebeck element chip;

a step of molding an insulating material in a form in which the metal lead wires are taken out in parallel, the metal lead wires are insulated by the insulating material from one another, and only connection terminal portions are projected out of the insulating material to make connection to an external circuit provided outside the integrated parallel Peltier Seebeck element chips; and a step of connecting to make series or parallel a Peltier Seebeck circuit system connecting two of the integrated parallel Peltier Seebeck element chips.

20. An integrated parallel Peltier Seebeck element chip fabricating process comprising:

a step of cutting off a plurality of integrated parallel Peltier Seebeck element chips formed by the fabricating process claimed in claim 1, individually with a cutter to provide individually cut off integrated parallel Peltier Seebeck element chips;

a step of attaching connection terminals by electrically connecting metal lead wires, which are electrically and thermally conductive, to connection terminals formed in a surface of each cut off integrated parallel Peltier Seebeck element chip;

a step of molding an insulating material in a form in which the metal lead wires are taken out in parallel, the metal lead wires are insulated by the insulating material from one another, and only connection terminal portions are projected out of the insulating material to make connection to an external circuit provided outside the integrated parallel Peltier Seebeck element chips; and a step of connecting, to make a series or parallel Peltier Seebeck circuit system, two of the integrated parallel Peltier Seebeck element chips.

21. An integrated parallel Peltier Seebeck element chip connecting process for forming a thermoelectric conversion element circuit system of a Peltier effect type or a Seebeck effect type by connecting a plurality of integrated parallel Peltier Seebeck element chips, comprising:

a step of preparing a silicon substrate having a uniform thickness, the silicon substrate being one of an amorphous silicon substrate, a polycrystalline silicon substrate and a monocrystalline silicon substrate;

a step of forming a plurality of chips by transferring, on the silicon substrate, a mask pattern to leave an even number of unoxidized portions in each chip;

a step of causing a chemical reaction with oxygen by putting, in an oxidation furnace, the substrate formed with a negative resist for the unoxidized portions corresponding to the mask pattern, altering a remaining portion other than the portions corresponding to the mask pattern into silicon dioxide, and thereby forming the substrate in which the remaining portion of the substrate other than the unoxidized portions is altered as a whole into an electrical insulating material;

a step of altering adjacent two of the unoxidized portions formed in one chip in the substrate, respectively, into first and second conductive members having different Seebeck coefficients;

a step of forming a thermal conduction terminal portion by connecting, by ohmic contact, surfaces of the adjacent first and second conductive members on one side with a first conductive joining member;

a step of forming terminal side portions for the first and second conductive members by covering surfaces of the first and second conductive members on an opposite side opposite to the side on which the first conductive joining member is provided, with a second conductive joining member by ohmic contact;

a step of connecting a plurality of third conductive joining members electrically with the terminal side portions of the first and second conductive members, respectively, and forming connecting terminal portions for connection to an external circuit in a state in which the third conductive joining members are arranged in parallel to one another, and insulated electrically from one another;

a step of repeating the above-mentioned steps for one chip, sequentially a number of times, over an entire surface of the substrate of the insulating material so that a plurality of chips are formed simultaneously;

a step of preparing a first cable which is a serial or parallel cable of a desired length having a male or female multi terminal connector including terminals equal in number to connection terminal portions on the integrated parallel Peltier Seebeck element chip and preparing, as an extension cable, a second cable which is a parallel cable of a desired length having, at both ends, male and female multi terminal connectors, or male and male multi terminal connectors, or female and female multi terminal connectors; and a step of connecting a plurality of the integrated parallel Peltier Seebeck element chips so as to form a circuit system of a series configuration, by using the first and second cables.

22. The integrated parallel Peltier Seebeck element chip connecting process as recited in claim 21, wherein the connecting process further comprises a step of connecting a plurality of said first cables, each of said first cables equipped with the multi terminal connectors, or connecting the first cable to a two terminal external circuit, by using an integrated connector tap including male type and female type two terminal connectors.

* * * * *